United States Patent [19]

Sunakawa et al.

[11] Patent Number: 5,227,009

[45] Date of Patent: Jul. 13, 1993

[54] MASKING SHEET AND METHOD OF PRODUCING PROCESSED METAL PRODUCT

[75] Inventors: Makoto Sunakawa, Osaka; Chikara Kohbayashi, Hyogo; Rokuo Ono, Osaka, all of Japan

[73] Assignees: Nitto Denko Corporation, Osaka; Shin Meiwa Industry, Hyogo, both of Japan

[21] Appl. No.: 849,621

[22] Filed: Mar. 10, 1992

[51] Int. Cl.$^5$ .......................... B32B 25/08; B44C 1/22
[52] U.S. Cl. .................................... 156/634; 156/654; 156/659.1; 156/904

[58] Field of Search ...................... 156/634, 654, 659.1, 156/904; 428/343, 355, 519; 427/272, 282, 307

[56] References Cited

U.S. PATENT DOCUMENTS 3,197,391 7/1965 Bowers .............................. 156/904
4,759,959 7/1988 Guy ..................................... 427/282

Primary Examiner—William J. Van Balen
Attorney, Agent, or Firm—Sughrue, Mion, Zinn, Macpeak & Seas

[57] ABSTRACT

A masking sheet comprising a corrosion-resistant film and, formed thereon, a layer of an adhesive comprising at least one of a chloroprene rubber, a nitrile rubber, and a styrene-butadiene rubber.

6 Claims, 1 Drawing Sheet

MASKING SHEET AND METHOD OF PRODUCING PROCESSED METAL PRODUCT

FIELD OF THE INVENTION

The present invention relates to a masking sheet suitable for masking use in, for example, etching treatment of metal surfaces, and a method of producing a processed metal product using the masking sheet.

BACKGROUND OF THE INVENTION

A method of producing a processed metal product has been proposed in which a metal article the surface of which is partly covered with a mask is subjected to etching treatment to remove a surface layer of predetermined parts of the metal article to thereby form a desired pattern for decoration or other purpose.

In such production methods, masking has conventionally been conducted by the known method of applying a coating liquid containing a polymer component such as a vinyl, epoxy, silicone, polyamide, polyethylene, styrene-butadiene copolymer, or gelatin (JP-B-48-2649 and JP-B-49-27024). (The term "JP-B" as used herein means an examined Japanese patent publication.)

However, the above technique has been defective in that a coating film having a uniform thickness is difficult to form, resulting often in uneven etching, and that it is difficult to strip off the mask after etching treatment. Further problems of the above masking technique have been that the coating film formation necessitates a drying step for removing solvent or a curing step, leading to poor production efficiency, and that it is difficult to control adhesion of the coating film to a metal article. If the coating film has too weak adhesion to a metal article, formation of a precise pattern through etching treatment is difficult because permeation of the etchant beneath the mask occurs at the edge of the mask. If the coating film has too strong adhesion, stripping of the mask after etching treatment is difficult.

In view of the above, the present inventors tried masking of a metal article with a commercially available adhesive sheet. This technique, however, was found unpractical because during etching treatment, permeation of the etchant occurred at the edge of the applied adhesive sheet or the adhesive sheet peeled from the metal article.

SUMMARY OF THE INVENTION

The present inventors have conducted intensive studies in order to improve the above-described adhesive sheet masking and to eliminate the problems of the prior art masking technique. As a result, they have succeeded in developing a masking sheet which is a special adhesive sheet having performance sufficient for practical use. The present invention has thus been completed.

Accordingly, the present invention provides a masking sheet comprising a corrosion-resistant film and, formed thereon, a layer of an adhesive comprising at least one of a chloroprene rubber, a nitrile rubber, and a styrene-butadiene rubber.

The present invention further provides a method of producing a processed metal product which comprises applying the above-described masking sheet to a metal article to thereby cover with the masking sheet, those covered parts of the metal article being untreated parts, and then subjecting the masked metal article to etching treatment with an etchant to thereby remove a surface layer in the uncovered part of the metal article.

Since the masking sheet comprising a corrosion-resistant film and, formed thereon, a layer of an adhesive comprising at least one of a chloroprene rubber, a nitrile rubber, and a styrene-butadiene rubber, can be made to have a proper adhesion, the permeation of an etchant during etching treatment of a metal article with its parts to be untreated being covered with the masking sheet can be prevented and the masking sheet after the etching treatment can be stripped smoothly. Therefore, the mask pattern can be precisely transferred to the metal article. Furthermore, since the adhesive sheet-type masking sheet covering parts to be untreated of the metal article can have a uniform thickness, uneven etching does not substantially occur. In addition, the etching treatment of metal articles using the above-described masking sheet for producing processed metal products can be conducted at an excellent efficiency because the masking sheet can be stripped off smoothly after etching and because the masking operation requires neither a drying step for solvent nor a curing step for coating film.

BRIEF DESCRIPTION OF THE DRAWING

The accompanying figure is a perspective view illustrating one embodiment of the method of the present invention.

DETAILED DESCRIPTION OF THE INVENTION

Figure 1:
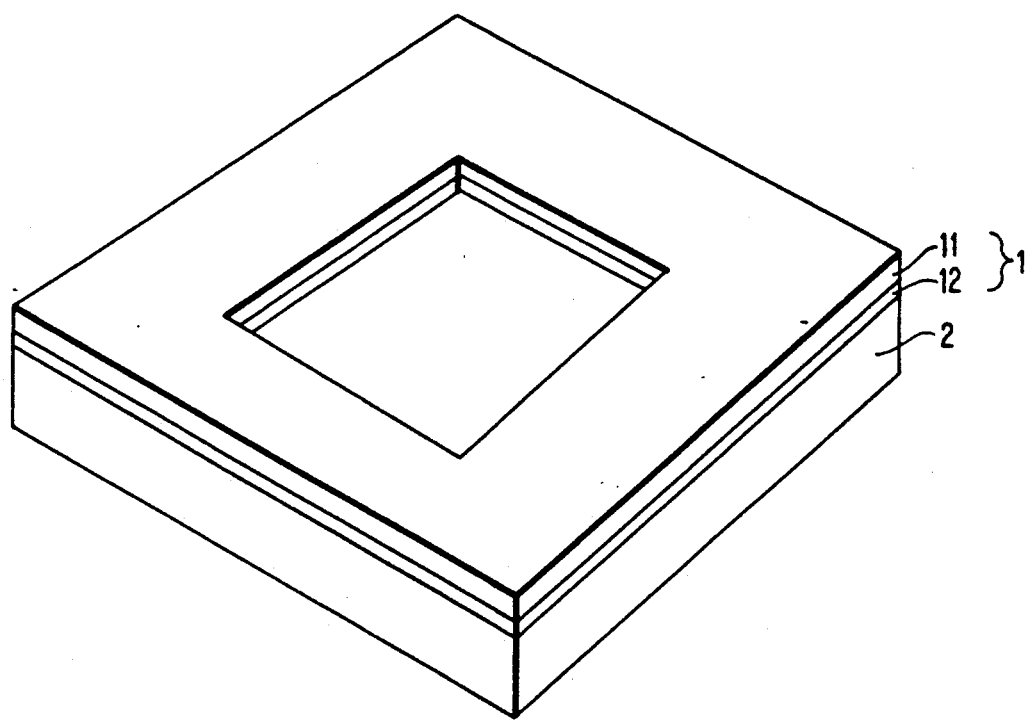

The masking sheet of the present invention is an adhesive sheet comprising a corrosion-resistant film and, formed thereon, a layer of an adhesive comprising at least one of a chloroprene rubber, a nitrile rubber, and a styrene-butadiene rubber.

As the corrosion-resistant film, a film having corrosion resistance sufficient for the intended use of the masking sheet is used. In the case where the masking sheet is for use in etching treatment of a metal, a film which withstands the etching treatment is employed. Examples of the corrosion-resistant film for such an application include films made of a polyester, polyethylene, polypropylene, ethylene-vinyl acetate copolymer, poly(vinyl chloride), vinyl chloride-vinyl acetate copolymer, ABS resin, and the like. Of these, films made of olefin-based polymers such as films of polyethylene, ethylene copolymers, and blends thereof and films of polypropylene, propylene copolymers, and blends thereof are preferably used, from the standpoints of processability during cutting to predetermined shapes and workability during peeling from metal articles. The corrosion-resistant film generally has a thickness of from 0.02 to 0.5 mm, and preferably from 0.03 to 0.3 mm. Too small film thicknesses are not preferred in that the film has insufficient strength and is apt to have defects such as pinholes. Too large film thicknesses are not preferred in that the film shows poor workability when applied to metal articles and the applied film is apt to peel off the metal article during etching treatment due to stress in the film.

Preferably, the side of the corrosion-resistant film on which an adhesive layer is to be formed is subjected to a modification treatment such as a surface oxidation treatment, e.g., corona treatment, flame treatment, and ozone treatment, for the purposes of improving adhesion of an adhesive layer to the film and preventing the adhesive from being transferred to (remaining on) the metal article when the masking sheet is stripped off the metal article.

The adhesive layer formed on the corrosion-resistant film is prepared from an adhesive comprising at least one of a chloroprene rubber, nitrile rubber, and styrene-butadiene rubber. Although the adhesive used for forming the adhesive layer in the masking sheet of the present invention usually is a chloroprene rubber-based adhesive, nitrile rubber-based adhesive, or styrene-butadiene rubber-based adhesive, the adhesive layer may also be made from, for example, an adhesive containing two or three of a chloroprene rubber, a nitrile rubber and a styrene-butadiene rubber. Examples of such an adhesive include a mixture of a chloroprene rubber-based adhesive and a nitrile rubber-based adhesive or the like, a blend of a chloroprene rubber-based adhesive with a nitrile rubber or other rubber, a blend of a nitrile rubber-based adhesive with a chloroprene rubber or other rubber, and similar compositions. Preferably employed adhesives are those having good tackiness and those which are heat-activable. Preferred of these are an adhesive containing a chloroprene rubber having a low crystallinity, an adhesive based on a blend of a methyl methacrylate-grafted chloroprene rubber with a methyl methacrylate-grafted chlorinated butyl rubber, an adhesive containing a nitrile rubber having a low nitrile content, and the like. In the case where the masking sheet is to be used in etching treatment, use of a chloroprene rubber-based adhesive is preferred from the standpoint of resistance to etchants.

The chloroprene rubber-based adhesive, nitrile rubber-based adhesive, and styrene-butadiene rubber-based adhesive each generally is a composition obtained by adding necessary components as a tackifier resin, filler, softener, crosslinking agent, and the like to a rubber component to control adhesion strength. Examples of ordinarily usable tackifier resins include highly polar resins such as phenolic resins, terpene-modified phenolic resins, rosin-modified phenolic resins, terpene resins, rosins, coumarone resins, and the like. Examples of ordinarily usable fillers include calcium carbonate, clay, colloidal silica, and the like. Examples of ordinarily usable softeners include phthalic acid esters such as dioctyl phthalate, various oils, and the like. Besides various vulcanizing agents, examples of ordinarily usable crosslinking agents include zinc oxide and magnesium oxide for chloroprene rubbers and polyfunctional isocyanates, melamine compounds, epoxy compounds, and the like for nitrile rubbers, particularly for carboxyl-modified nitrile rubbers. In general, the thickness of the adhesive layer formed on the corrosion-resistant film is from 0.01 to 0.2 mm.

The masking sheet of the present invention can be used in a variety of applications such as masking or surface protection of various articles and of various articles during processing, surface treatment of metal articles, and other uses.

According to the method of the present invention for producing a processed metal product, a masking sheet of the kind described above comprising a corrosion-resistant film and, formed thereon, a layer of an adhesive comprising at least one of a chloroprene rubber, a nitrile rubber, and a styrene-butadiene rubber is applied to a metal article thereby to cover with the masking sheet those covered parts of the metal article being untreated parts, and the masked metal article is then subjected to etching treatment with an etchant to thereby remove a surface layer in the uncovered part of the metal article. This method is illustrated in the accompanying drawing, in which numeral 1 denotes a masking sheet, 2 a metal article, 11 a corrosion-resistant film, and 12 an adhesive layer.

Covering with a masking sheet of those parts of a metal article which are to be untreated can be conducted in a suitable manner. For example, the whole surface of a metal article is first covered with a masking sheet and a predetermined part of the applied masking sheet is then cut out. Alternatively, a masking sheet which has been processed beforehand so as to bear a desired cut-out pattern is bonded to a metal article.

Etching treatment of the masked metal article, in which the parts required to be untreated are covered with the masking sheet, can be suitably conducted according to a conventional way. Treating conditions including treating time and treating temperature can be arbitrarily determined according to the desired etching thickness (depth) and other considerations. Further, an arbitrary etchant selected from alkaline etchants, acid etchants, and others can be used according to the metal article to be treated.

In a generally employed etching method, the masked metal article is immersed in an etchant which is an alkaline aqueous solution containing sodium hydroxide, potassium hydroxide, or the like at a concentration of from several percents to several tens of percents by weight. In this case, etching treatment is conducted while the etchant is being heated usually at around 100° C., in order to attain good treating efficiency. A masking sheet which can be advantageously used in such etching treatment is one which has been regulated so as to adhere to the metal article at an adhesion strength of from 200 to 1,600 g/20 mm at 20° C. and an adhesion strength of 300 g/20 mm or more at 100° C. as measured by 180° peeling at a peel rate of 300 mm/min and to suffer a thermal shrinkage of 0.5% or less in each of the length and width directions during the etching treatment. Use of such masking sheet brings about the following effects. That is, partial removal of the masking sheet covering a metal article for exposing an etching part of the metal article can be conducted without leaving an adhesive on the etching part. Further, during etching treatment of the masked metal article, permeation of the etchant and peeling of the mask due to thermal shrinkage stress can be avoided. Furthermore, after the etching treatment, the mask can be smoothly stripped off the metal article without leaving an adhesive on the metal article. By the etching treatment, a surface layer of the desired part of the metal article is removed. In the case where etching is conducted by immersing a masked metal article in an etchant, the part uncovered with the masking sheet in the metal article is etched. In order that the back side, for example, of a metal article is left unetched without covering this side with a masking sheet, spray etching can, for example, be used in which an etchant is sprayed on only the masked front side of the metal article. After etching treatment, the masking sheet is stripped off the metal article to obtain a processed metal product bearing the desired pattern.

The method for producing a processed metal product of the present invention can be applied to articles made of various metals such as aluminum, magnesium, titanium, steel, stainless steel, and copper and in the shape of plate or cylinder or in other arbitrary shape. The method of the present invention is also applicable to other various metal processings such as surface processing of a metal article to form a decorative pattern on the surface thereof, thickness-reduction processing or surface treatment of a predetermined part of a metal article, and surface-roughening treatment of a metal article.

According to the present invention, due to the use of the specific masking sheet which can withstand etching treatment even under high temperature conditions, permeation of the etchant beneath the masking sheet can be prevented and, hence, the mask pattern can be precisely transferred to the metal article. The masking sheet also has the advantage of being smoothly stripped off after etching treatment.

Furthermore, since the masking sheet is of the adhesive sheet type, masking of a metal article to be treated can be easily attained at a uniform thickness with good processability without any limitation posed by pot life and without the necessity of drying of solvent or curing of coating film. Therefore, the method of the present invention is excellent not only in masking efficiency and precision but also in the efficiency of the production of processed metal products free of etching unevenness.

The present invention will be explained in more detail by reference to the following examples, which should not be construed as limiting the scope of the invention. In these examples, all parts are by weight.

EXAMPLE 1

One side of a 0.06 mm thick corrosion-resistant film made of a blend of 9 parts of polypropylene and 1 part of an ethylene-vinyl acetate copolymer (vinyl acetate content; 12 wt %) was subjected to corona treatment. The resulting film was coated on the treated side with a chloroprene rubber-based adhesive to form an adhesive layer having a thickness of 0.05 mm, thereby obtaining a masking sheet. The chloroprene rubber-based adhesive used above had been obtained by mixing 100 parts of a chloroprene rubber, 5 parts of MgO, 3 parts of ZnO, 5 parts of a phenolic resin, 5 parts of a silica-type filler, 1 part of an anti-aging agent, and 1 part of carbon black with 300 parts of toluene and 100 parts of methyl ethyl ketone.

The above-obtained masking sheet was press-bonded to a cleaned aluminum plate by means of a laminating roll heated at 50° C. Subsequently, a predetermined incised pattern was formed with a knife in the applied masking sheet and a predetermined part of the masking sheet was then peeled off to thereby expose that part of the aluminum plate which was to be etched. Etching treatment was then carried out by immersing the masked aluminum plate in a 15% aqueous solution of sodium hydroxide at 100° C. for about 10 minutes.

The aluminum plate was then taken out and washed with water and the masking sheet was stripped off, thereby obtaining a processed aluminum plate in which the predetermined part of the surface thereof had been precisely treated.

The adhesion strength of the above masking sheet to an aluminum plate was 1,230 g/20 mm at 20° C. and 960 g/20 mm at 100° C. (as measured by 180° peeling at a peel rate of 300 mm/min; hereinafter the same).

In the above etching treatment, whether permeation of the etchant into the interface between the masking sheet and the aluminum plate occurred or not was examined. Moreover, the masking sheet was further evaluated with regard to the strippability thereof from the aluminum plate before and after the etching treatment and as to whether stripping of the masking sheet left adhesive on the aluminum plate surface.

The results obtained are shown in the Table below. (The same examinations for masking sheet evaluation were conducted in the following examples.)

EXAMPLE 2

One side of a 0.15 mm thick corrosion-resistant film made of a blend of 9 parts of polyethylene and 1 part of an ethylene-vinyl acetate copolymer (vinyl acetate content; 12 wt %) was subjected to corona treatment. The resulting film was coated on the treated side with a chloroprene rubber-based adhesive to form an adhesive layer having a thickness of 0.2 mm, thereby obtaining a masking sheet. The chloroprene rubber-based adhesive used above had been obtained by mixing 100 parts of a chloroprene rubber, 10 parts of MgO, 2 parts of ZnO, 10 parts of a phenolic resin, 3 parts of an isocyanate compound, 2 parts of an anti-aging agent, and 1 part of carbon black with 300 parts of toluene and 100 parts of methyl ethyl ketone.

Using the above-obtained masking sheet, masking and etching treatment were conducted in the same manner as in Example 1. Thus, a processed aluminum plate was obtained in which the predetermined part of the surface thereof had been precisely treated.

The adhesion strength of the above masking sheet to an aluminum plate was 1,050 g/20 mm at 20° C. and 1,200 g/20 mm at 100° C.

EXAMPLE 3

One side of a 0.06 mm thick corrosion-resistant film made of a blend of 9 parts of polypropylene and 1 part of an ethylene-vinyl acetate copolymer (vinyl acetate content; 12 wt %) was subjected to corona treatment. The resulting film was coated on the treated side with a nitrile rubber-based adhesive to form an adhesive layer having a thickness of 0.1 mm, thereby obtaining a masking sheet. The nitrile rubber-based adhesive used above had been obtained by mixing 100 parts of a carboxyl-modified nitrile rubber, 30 parts of a novolak-type phenolic resin, 5 parts of a silica-type filler, 2 parts of a polyfunctional isocyanate, and 1 part of an anti-aging agent with 200 parts of toluene and 200 parts of methyl ethyl ketone.

Using the above-obtained masking sheet, masking and etching treatment were conducted in the same manner as in Example 1. Thus, a processed aluminum plate was obtained in which the predetermined part of the surface thereof had been precisely treated.

The adhesion strength of the above masking sheet to an aluminum plate was 800 g/20 mm at 20° C. and 960 g/20 mm at 100° C.

COMPARATIVE EXAMPLE 1

An adhesive sheet was prepared which was composed of a 0.06 mm thick polypropylene film one side of which had undergone corona treatment and a 0.05 mm thick adhesive layer formed on the treated side of the film and made of an acrylic pressure-sensitive adhesive. Using this adhesive sheet as a masking sheet, a surface-treated aluminum plate was obtained in the same manner as in Example 1.

COMPARATIVE EXAMPLE 2

An adhesive sheet was prepared which was composed of a 0.15 mm thick polypropylene film one side of which had undergone corona treatment and a 0.2 mm thick adhesive layer formed on the treated side of the film and made of a natural rubber-based pressure-sensitive adhesive. Using this adhesive sheet as a masking sheet, a surface-treated aluminum plate was obtained in the same manner as in Example 2.

COMPARATIVE EXAMPLE 3

An adhesive sheet was prepared which was composed of a 0.06 mm thick polyester film one side of which had undergone corona treatment and a 0.1 mm thick adhesive layer formed on the treated side of the film and made of an acrylic pressure-sensitive adhesive. Using this adhesive sheet as a masking sheet, a surface-treated aluminum plate was obtained in the same manner as in Example 3.

COMPARATIVE EXAMPLE 4

An adhesive sheet was prepared which was composed of a 0.06 mm thick polyester film one side of which had undergone corona treatment and a 0.05 mm thick adhesive layer formed on the treated side of the film and made of a silicone-based pressure-sensitive adhesive. Using this adhesive sheet as a masking sheet, a surface-treated aluminum plate was obtained in the same manner as in Example 1.

|  | Permeation of etchant | Before Etching | | After Etching | |
| --- | --- | --- | --- | --- | --- |
|  |  | Strippability | Residual adhesive | Strippability | Residual adhesive |
| Example 1 | Not occurred | Good | None | Good | None |
| Example 2 | Not occurred | Good | None | Good | None |
| Example 3 | Not occurred | Good | None | Good | None |
| Comparative Example 1 | Occurred | Good | None | Peeled off during etching | |
| Comparative Example 2 | Occurred | Good | None | | |
| Comparative Example 3 | Occurred | Broke | Present | | |
| Comparative Example 4 | Occurred | Good | None | Good | None |

While the invention has been described in detail and with reference to specific embodiments thereof, it will be apparent to one skilled in the art that various changes and modifications can be made therein without departing from the spirit and scope thereof.

What is claimed is:

1. A masking sheet comprising a corrosion-resistant film and, formed thereon, a layer of an adhesive comprising at least one of a chloroprene rubber, a nitrile rubber, and a styrene-butadiene rubber.

2. A masking sheet as claimed in claim 1, wherein said corrosion-resistant film is made of an olefin-based polymer.

3. A method of producing a processed metal product which comprises applying the masking sheet as claimed in claim 1 to a metal article to cover the same with the masking sheet, those covered parts of the metal article being untreated parts, and then subjecting the masked metal article to etching treatment with an etchant to remove a surface layer in the uncovered part of the metal article.

4. A method as claimed in claim 3, wherein the adhesion strength of said masking sheet to the metal article is from 200 to 1,600 g/20 mm at 20° C. as measured by 180° peeling at a peel rate of 300 mm/min.

5. A method as claimed in claim 3, wherein the adhesion strength of said masking sheet to the metal article is 300 g/20 mm or more at 100° C. as measured by 180° peeling at a peel rate of 300 mm/min.

6. A method as claimed in claim 3, wherein said masking sheet suffers a thermal shrinkage of 0.5% or less in each of the length and width directions during the etching treatment.

* * * * *